US 6,609,243 B1

(12) United States Patent
Evans et al.

(10) Patent No.: US 6,609,243 B1
(45) Date of Patent: Aug. 19, 2003

(54) LAYOUT ARCHITECTURE TO OPTIMIZE PATH DELAYS

(75) Inventors: Brian P. Evans, Starkville, MS (US); Jeffery Scott Hunt, Ackerman, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 51 days.

(21) Appl. No.: 09/941,352

(22) Filed: Aug. 29, 2001

(51) Int. Cl.[7] ............................................. G06F 17/50
(52) U.S. Cl. ........................ 716/16; 716/2; 716/5; 716/17
(58) Field of Search ............................ 716/16, 12, 17, 716/18, 2, 5

(56) References Cited

U.S. PATENT DOCUMENTS

| | | | | | |
|---|---|---|---|---|---|
| 5,923,868 | A | * | 7/1999 | Nazarian et al. | 703/21 |
| 6,005,428 | A | * | 12/1999 | Amdahl | 327/161 |
| 6,467,073 | B1 | * | 10/2002 | Merchant | 716/16 |
| 6,476,635 | B1 | * | 11/2002 | Rahim et al. | 326/41 |
| 6,490,712 | B1 | * | 12/2002 | Merchant et al. | 716/12 |

* cited by examiner

Primary Examiner—Vuthe Siek
Assistant Examiner—Magid Y Dimyan
(74) Attorney, Agent, or Firm—Christopher P. Maiorana, P.C.

(57) ABSTRACT

An apparatus comprising a first stage and a second stage. The first stage may comprise a first section and a second section. The second stage may be embedded between the first and second sections. The first and second stages may be configured to equalize signal paths between a plurality of inputs of the first stage and a plurality of outputs of the second stage.

18 Claims, 4 Drawing Sheets

LAYOUT ARCHITECTURE TO OPTIMIZE PATH DELAYS

FIELD OF THE INVENTION

The present invention relates to a method and/or architecture for implementing programmable interconnect matrices (PIMs) that contain two or more stages generally and, more particularly, to a method and/or architecture for implementing a PIM that equalizes the delay in stage-to-stage routing.

BACKGROUND OF THE INVENTION

Referring to FIG. 1, a conventional programmable interconnect matrix (PIM) 10 is shown. The PIM 10 includes a first stage 12 and a second stage 14. The first stage 12 has a number of multiplexers 16a–16n. The second stage 14 has a number of multiplexers 18a–18n. An output of the multiplexers 16a–16n is used as an input to the multiplexers 18a–18n. The conventional configuration results in routes of different length connecting the first stage 12 and the second stage 14. The different lengths of the individual routes result in different delays, depending on the path taken through the PIM 10. With the conventional configuration, the lengths of the individual routes connecting the first stage 12 to the second stage 14 are different. Therefore, the delays are difficult, if not impossible, to equalize. The propagation delay through the worst case path of the PIM 10 sets the overall delay specification for all paths. Additionally, connections from stage-to-stage can become congested. Reducing or eliminating the congestion can require routing outside the multiplexer bounding box.

SUMMARY OF THE INVENTION

The present invention concerns an apparatus comprising a first stage and a second stage. The first stage may comprise a first section and a second section. The second stage may be embedded between the first and second sections. The first and second stages may be configured to equalize signal paths between a plurality of inputs of the first stage and a plurality of outputs of the second stage.

The objects, features and advantages of the present invention include providing an architecture for implementing programmable interconnect matrices containing two or more stages That may (i) optimize path delays, (ii) allow different paths to have relatively the same delay, (iii) equalize the delay in the stage-to-stage routing, and/or (iv) configure routing lengths (e.g., horizontal, vertical, etc.) to equalize overall path delay.

BRIEF DESCRIPTION OF THE DRAWINGS

These and other objects, features and advantages of the present invention will be apparent from the following detailed description and the appended claims and drawings in which:

FIG. 3 is a detailed block diagram of the circuit of FIG. 2a;

DETAILED DESCRIPTION OF THE PREFERRED EMBODIMENTS

Figure 2A:
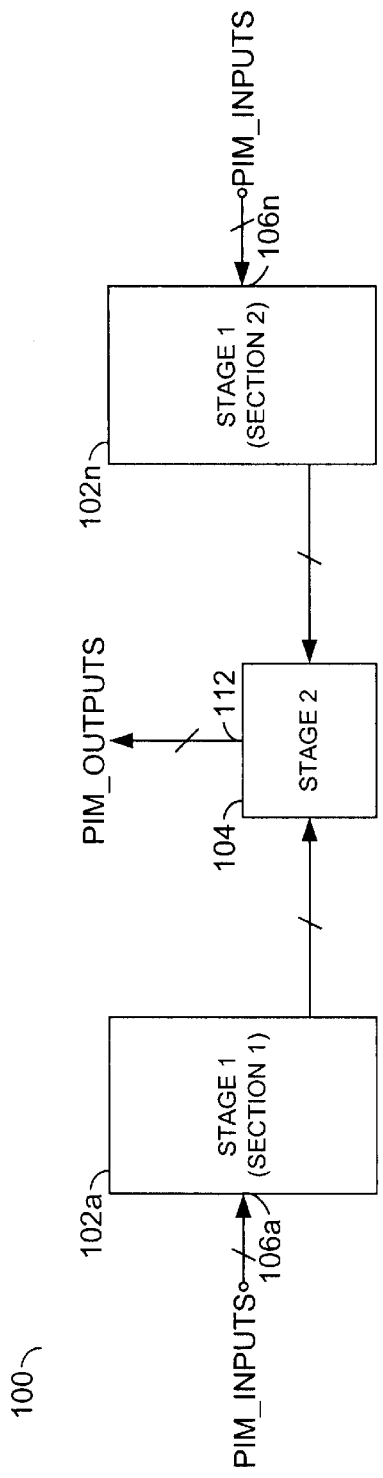
FIGS. 2(a–b) are block diagrams of preferred embodiments of the present invention.
Figure 2B:
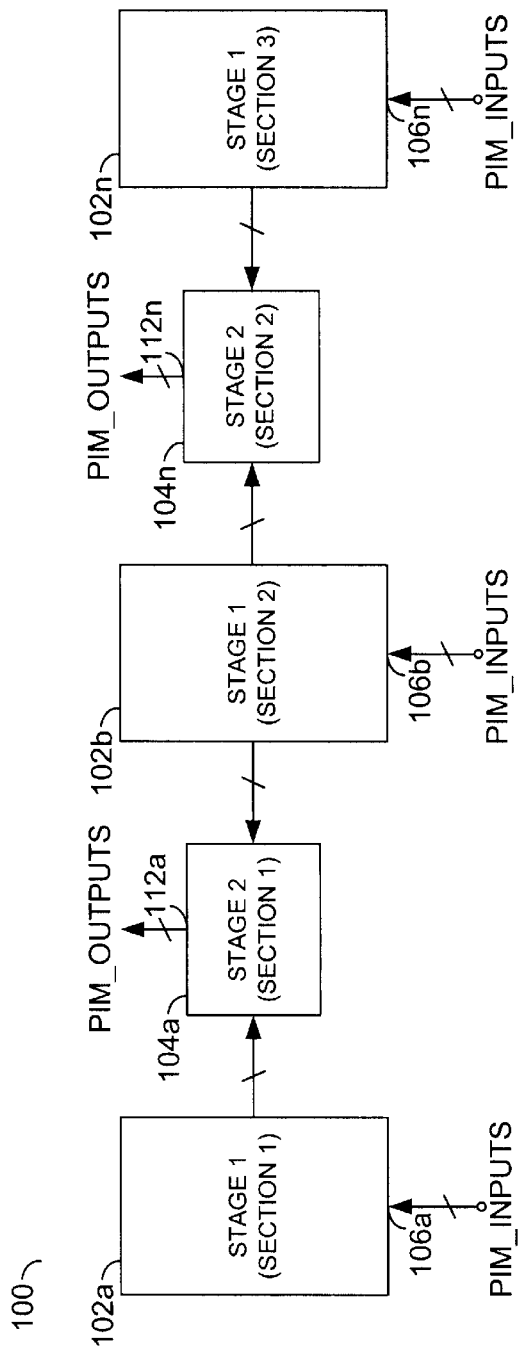

Referring to FIGS. 2a and 2b, a system (or circuit) 100 is shown in accordance with a preferred embodiment of the present invention. The circuit 100 may be configured to optimize path lengths and/or delays between two or more stages. The circuit 100 may be implemented, in one example, as two or more stages of a programmable interconnect matrix (PIM), that may allow for optimization (e.g., equalization) of delay paths through the PIM.

The circuit 100 may comprise a first stage 102 and a second stage 104. FIG. 2a generally illustrates the circuit 100 comprising a first stage with two sections 102a and 102n and a second stage 104 with one section. FIG. 2b generally illustrates the circuit 100 comprising a first stage with three sections 102a, 102b and 102n and a second stage with two sections 104a and 104n. However, other numbers of stages and/or sections may be implemented to meet the design criteria of a particular application. Additionally, the stages 102 and 104 may be implemented as a collection of multiplexers (to be discussed in more detail in connection with FIG. 3).

Each of the first stage sections 102a–102n may have an input 106a–106n that may receive a signal (e.g., PIM_INPUTS). Each of the sections 102a–102n may be connected to the second stage 104. The second stage 104 may have an output 112 that may present a signal (e.g., PIM_OUTPUTS). The connections may be optimized to equalize path delays. For example, the connections between the first stage 102 and the second stage 104 may be configured to provide similar delays along each path between the inputs 106a–106n and the output 112. The signals PIM_INPUTS and PIM_OUTPUTS may comprise single-bit signals and/or multi-bit signals.

Multi-stage implementations may be configured to provide an output of a stage to an input of a next stage. Multi-stage implementations may also create multiple paths from stage-to-stage. However, the circuit 100 may allow all paths through a PIM to have relatively the same delay. Therefore, the circuit 100 may allow devices that utilize the outputs of a PIM to account for the same overall delay regardless of the path of a signal through the PIM. The circuit 100 may help to reduce setup/hold requirements (or window) of a critical circuit path, when utilizing different paths through a PIM. In addition, when the circuit 100 is re-programmed (thus utilizing different signal paths), devices using the PIM_OUTPUTS may not need setup/hold adjustments or other compensation for delays due to different path lengths.

Figure 1:
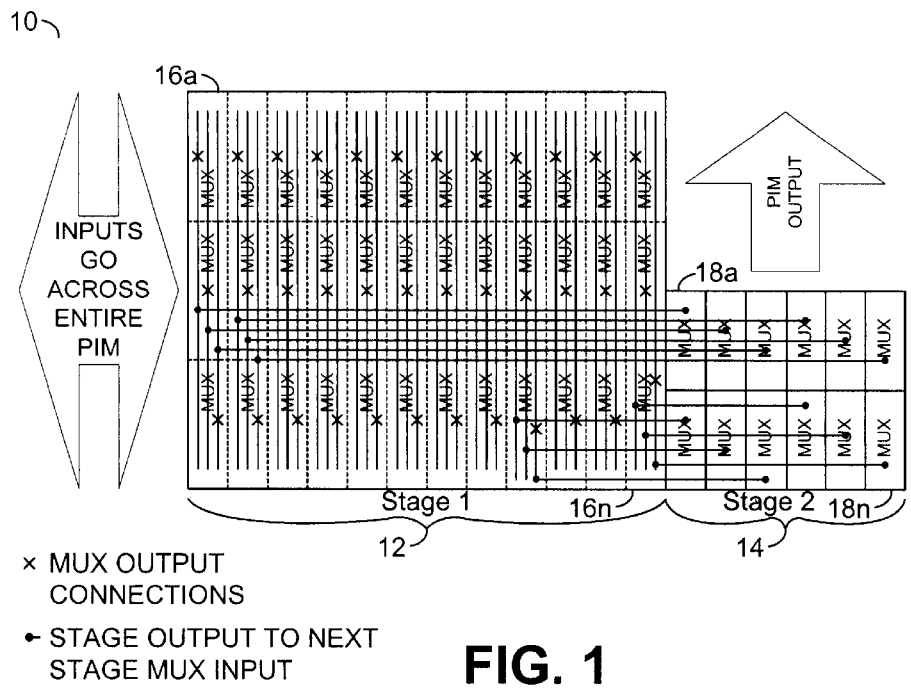
FIG. 1 is a block diagram of a conventional architecture.
Figure 3:
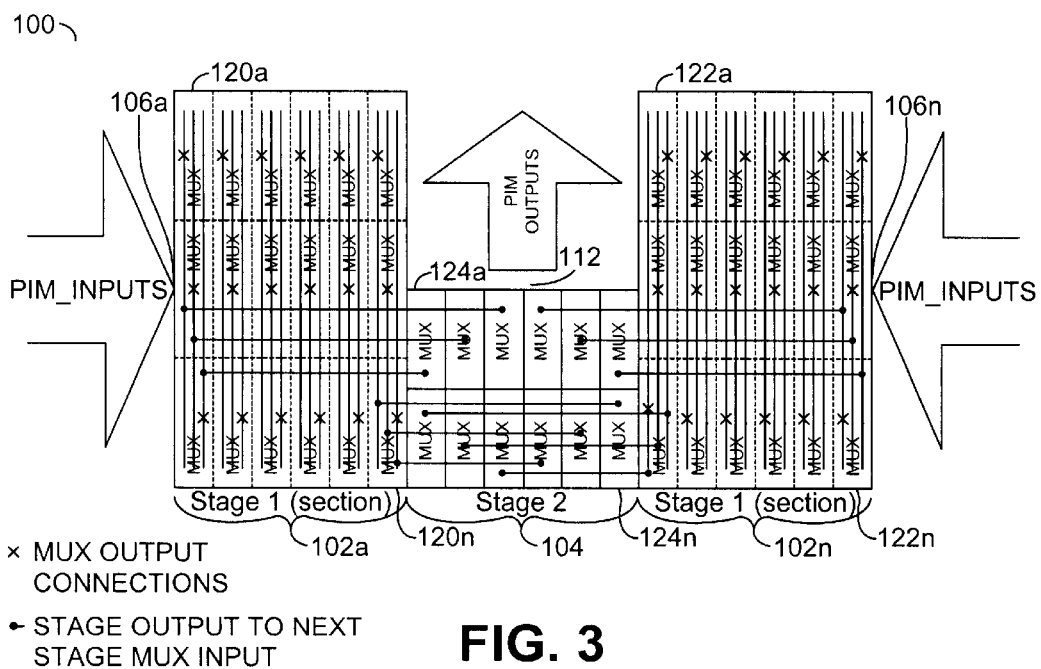

Referring to FIG. 3, a detailed diagram of the first stage 102 and the second stage 104 of FIG. 2a is shown. The first section 102a of the first stage generally comprises a number of multiplexers 120a–120n. The second section 102n of the first stage generally comprises a number of multiplexers 122a–122n. The second stage 104 generally comprises a number of multiplexers 124a–124n. The multiplexers 120a–120n may receive the signal PIM_INPUTS. The multiplexers 120a–120n and the multiplexers 124a–124n may have a number of interconnections. The multiplexers 122a–122n may receive the signal PIM_INPUTS. The multiplexers 122a–122n and the multiplexers 124a–124n may have a number of interconnections. The multiplexers 124a–124n may be configured to generate the signal PIM_OUTPUTS in response to the signal PIM_INPUTS received from the first stage sections 102a–102n.

Figure 4A:
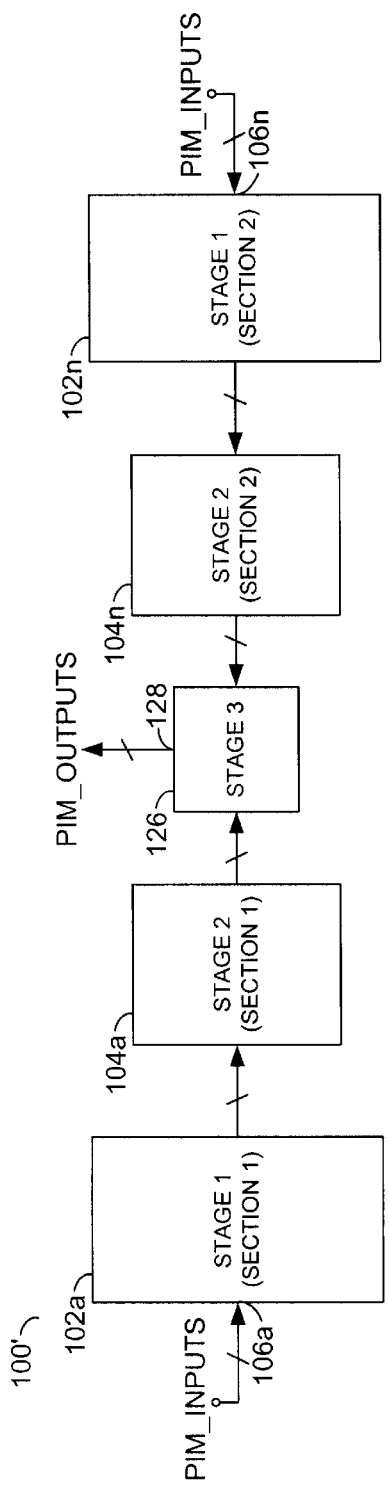
FIGS. 4(a–b) are block diagrams illustrating alternate embodiments of the present invention.
Figure 4B:
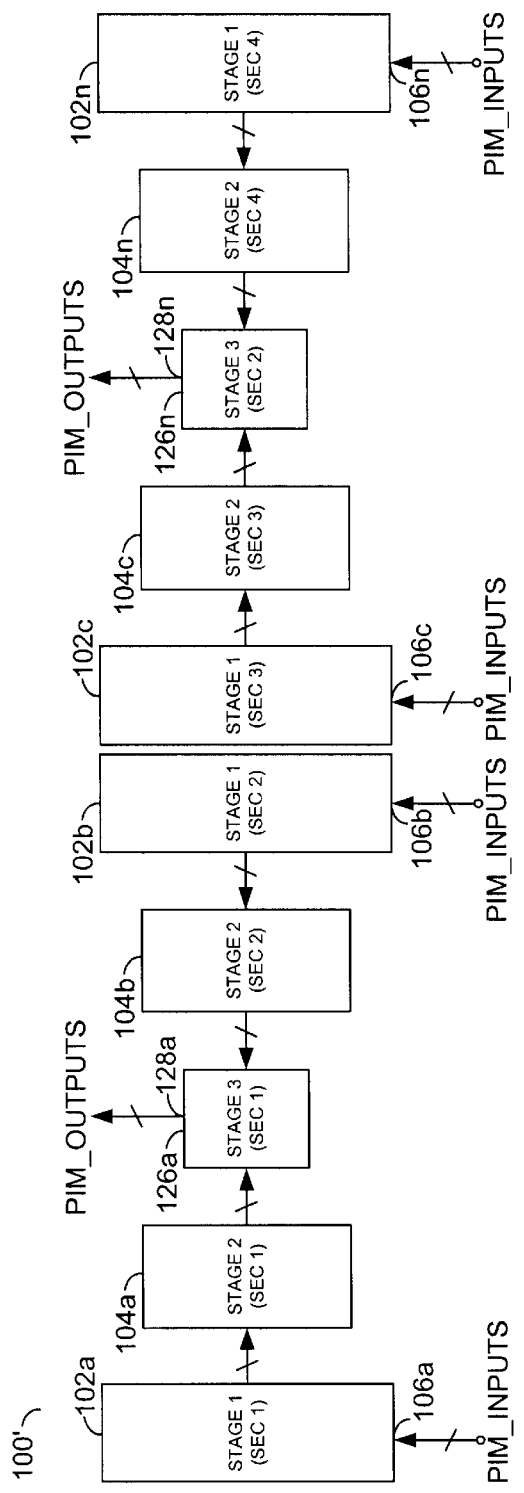

Referring to FIGS. 4a and 4b, a circuit 100' is shown illustrating an alternate embodiment of the present invention. The circuit 100' may be similar to the circuit 100. FIG. 4a generally illustrates an implementation of a first stage with two sections 102a and 102n, a second stage with two sections 104a and 104n and a third stage 126 with one section. The signal PIM_INPUTS may be presented to inputs 106a–106n of the sections 102a–102n. The signal PIM_INPUTS may propagate through the first and second stages 102 and 104 to the third stage 126. The third stage 126 may have an output 128 that may present the signal PIM_OUTPUTS.

FIG. 4b generally illustrates a first and second stage divided into four sections 102a–102n and 104a–104n, respectively, and a third stage divided into two sections 126a and 126n. Each section of the third stage 126a–126n may have an output 128a–128n that may present the signal PIM_OUTPUTS. The circuit 100' may provide stage-to-stage routing that may be configured to equalize the combined routing lengths (e.g., horizontal, vertical, etc.) of each path.

Figure 5A:
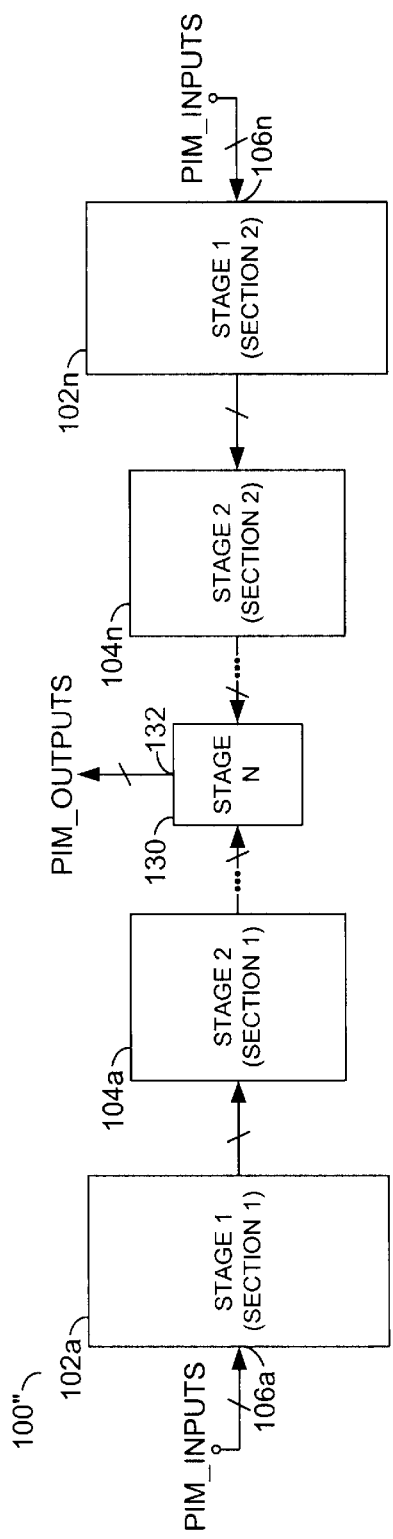
FIGS. 5(a–b) are block diagrams illustrating alternate embodiments of the present invention.
Figure 5B:
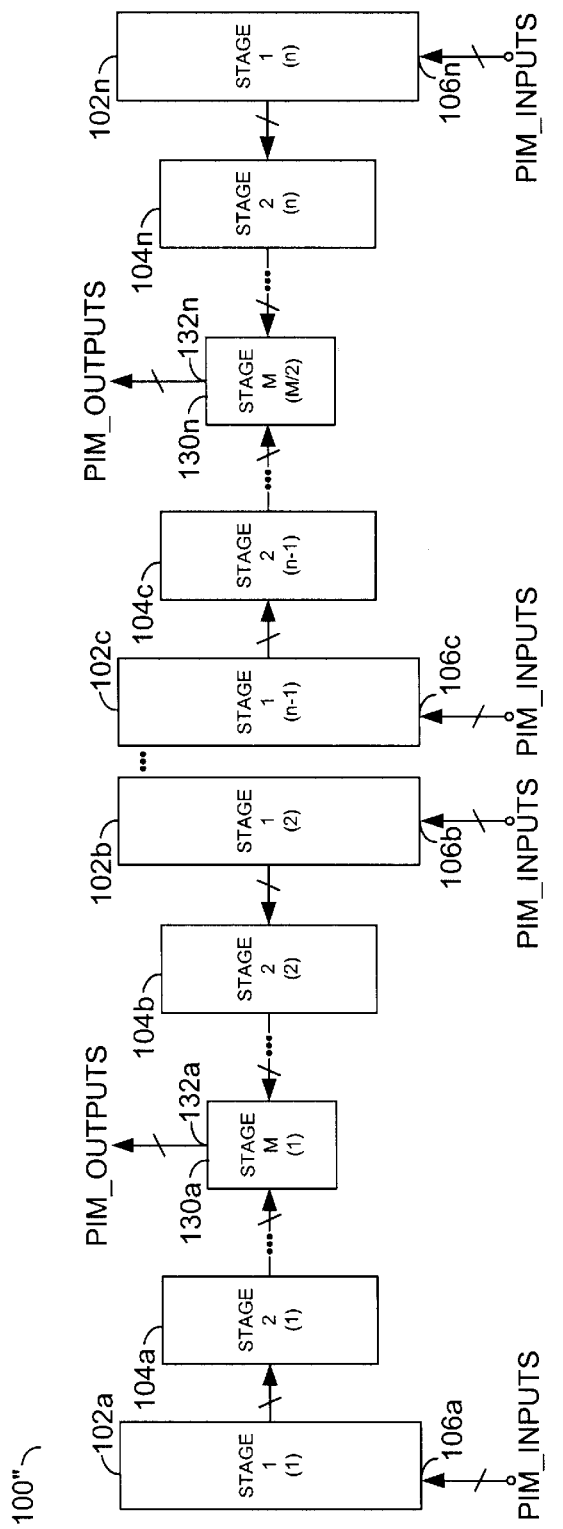

Referring to FIGS. 5a and 5b, a circuit 100" is shown illustrating another alternate embodiment of the present invention. The circuit 100" may be similar to the circuit 100. FIG. 5a generally illustrates an implementation of an N stage PIM comprising a first stage with two sections 102a and 102n, a second stage with two sections 104a and 104n and an Nth stage 130 with one section, where N is an integer. The signal PIM_INPUTS may be presented to inputs 106a–106n of the first state 102. The Nth stage 130 may have an output 132 that may present the signal PIM_OUTPUTS.

FIG. 5b generally illustrates an implementation comprising (M-1) stages with (n) sections 102a–102n and 104a–104n and an Mth stage with M/2 sections 130a–130n. The signal PIM_INPUTS may be presented to the inputs 106a–106n of the sections 102a–102n of the first stage. The sections 130a–130n of the Mth stage may each have an output 132a–132n that may present the signal PIM_OUTPUTS. The circuit 100" may provide stage-to-stage routing that may be configured to equalize the combined lengths (e.g., horizontal, vertical, etc.) along each path through the circuit 100".

The present invention may split a stage into a number of sections and place a next stage between the split sections of a previous stage. For example, the circuit 100 of FIG. 2a may place the second stage 104 between the first stage sections 102a and 102n. However, other appropriate configurations may be implemented depending on a number of stages and/or sections. The present invention may place the routes (e.g., horizontal, vertical, etc.) from a first stage to a second stage such that the total length of each path from an input of the first stage to an output of the second stage is substantially equal. The circuit 100 may also share routing channels (e.g., horizontal, vertical, etc.) of the first stage 102 and the second stage 104. The circuit 100 may utilize the same horizontal track from the first section of the first stage 102a to the second stage 104 as well as the second section of the first stage 102n to the second stage 104. Additionally, if stage-to-stage connections cannot share the same routing track, the circuit 100 may implement shortest connection routes. The circuit 100 may be configured to route the stage-to-stage connections using a unique method.

When the circuit 100 is re-programmed to select different paths, circuits connected to the outputs may not need setup/hold adjustments or compensation for delays due to different paths selected. The circuit 100 may be configured to optimize path delays. The circuit 100 may allow for all paths through a PIM to have relatively the same delay. The circuit 100 may provide consistent delay for a signal independent of a path through the PIM. Additionally, for circuits that have setup/hold paths that utilize the outputs of the PIM, a smaller setup/hold window adjustment may be provided.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first stage comprising a first section and a second section; and
   a second stage between said first and second sections, wherein said first and second stages are configured to equalize signal paths between a plurality of inputs of said first stage and a plurality of outputs of said second stage, wherein said first and second sections are further configured to couple longer stage-to-stage connections to shorter routes of said outputs.

2. The apparatus according to claim 1, wherein said second stage comprises (i) a third section and a fourth section and (ii) a third stage, wherein said third stage is configured to generate said output signals in response to a plurality of intermediary signals generated by said third and fourth sections of said second stage.

3. The apparatus according to claim 2, wherein said third stage is embedded within said third and fourth sections.

4. The apparatus according to claim 1, wherein said apparatus comprises a programmable interconnect matrix (PIM).

5. The apparatus according to claim 1, wherein said first and second sections of said first stage are configured to route said inputs to said second stage.

6. The apparatus according to claim 5, wherein said first and second sections are further configured to share one or more routing channels between said first stage and said second stage.

7. The apparatus according to claim 5, wherein said first and second sections are further configured to not share said routing channels between said first stage and said second stage.

8. The apparatus according to claim 5, wherein said first and second sections are further configured to equalize path delay.

9. The apparatus according to claim 1, wherein said first and second stages each comprise one or more multiplexers.

10. The apparatus according to claim 1, wherein said first and second sections are further configured to equalize a delay of a path followed by said inputs.

11. An apparatus comprising:
    means for providing a first stage comprising a first section and a second section;
    means for implementing a second stage between said first and second sections; and
    means for equalizing signal paths between a plurality of inputs of said first stage and a plurality of outputs of said second stage, wherein said first and second sections are further configured to couple longer stage-to-stage connections to shorter routes of said outputs.

12. A method for optimizing delay paths, comprising the steps of:
    (A) providing a first stage comprising a first section and a second section;
    (B) implementing a second stage between said first and second sections; and (C) equalizing signal paths between a plurality of inputs of said first stage and a plurality of outputs of said second stage and routing said inputs to said outputs.

13. The method according to claim 12, wherein step (C) further comprises:

sharing one or more routing channels between said first and second sections and said second stage.

14. The method according to claim 12, wherein step (C) further comprises:

not sharing said routing channels between said first and second sections and said second stage.

15. The method according to claim 12, wherein step (C) further comprises:

equalizing path delays from said inputs to said outputs.

16. The method according to claim 12, further comprising:

generating said output signals with a third stage in response to a plurality of intermediary signals generated by said second stage, said second stage comprising a third section and a fourth section.

17. The method according to claim 16, wherein said third stage is embedded within said third and fourth sections of said second stage.

18. The method according to claim 12, wherein step (C) further comprises:

equalizing a total length of each signal path.

* * * * *